(12) United States Patent
Kuo et al.

(10) Patent No.: US 8,940,586 B2
(45) Date of Patent: Jan. 27, 2015

(54) MECHANISM FOR MEMS BUMP SIDE WALL ANGLE IMPROVEMENT

(75) Inventors: Chris Kuo, Taipei (TW); Lee-Chuan Tseng, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 128 days.

(21) Appl. No.: 13/303,754

(22) Filed: Nov. 23, 2011

(65) Prior Publication Data

US 2013/0127036 A1 May 23, 2013

(51) Int. Cl.
*H01L 21/00* (2006.01)
*H01L 21/44* (2006.01)
(Continued)

(52) U.S. Cl.
CPC ....... *B81B 3/001* (2013.01); *H01L 2224/10135* (2013.01); *H01L 2224/10165* (2013.01);
(Continued)

(58) Field of Classification Search
CPC ..... H01L 21/302; H01L 21/768; H01L 21/44; H01L 21/476371; H01L 21/70; H01L 21/00; H01L 24/81; H01L 24/11; H01L 24/05; H01L 24/06; H01L 24/03; H01L 24/13; H01L 2224/10135; H01L 2224/16145; H01L 2224/8114; H01L 2224/13021; H01L 2224/81139; H01L 2224/10165; H01L 2224/05027; H01L 2224/05008; H01L 2224/05022; H01L 2224/05155; H01L 2224/05164; H01L 2224/05541; H01L 2224/05548; H01L 2224/05571; H01L 2224/05572; H01L 2224/05644; H01L 2224/05583; H01L 2224/0401; H01L 2224/13022; H01L 2224/13023; H01L 2224/13027; H01L 2224/13099; H01L 2224/131; H01L 2924/01078; H01L 2924/00012; H01L 2924/00014; H01L 2924/207; H01L 2924/131; H01L 2924/014
USPC ............. 438/125, 595, 50–53, 296, 613, 632, 438/652.618, 692, 700, FOR. 343, 98, 121, 438/453.52, 3, 533, 622, 680, 681, 428, 438/436, 438, 646, 696, 760, 213; 257/416, 257/415, 508, 622, 704, 791.288, 738, E21, 257/505, E21.585, 673, 737, E21.503, 257/E21.508, E21.628, E23.021, E23.023, 257/E23.033, E23.068, E23.069, E23.181, 257/E27.06; 73/514.01, 514.31–514.39, 73/510; 216/88, 2, 89
See application file for complete search history.

(56) References Cited

U.S. PATENT DOCUMENTS 7,736,931 B1 * 6/2010 Guo ................................ 438/52
2004/0101786 A1 * 5/2004 Meagley ........................ 430/322
(Continued)

OTHER PUBLICATIONS

Jack Xuan, et al. "Optimization of Bump Shape and Pattern in Laser-Texture Design for Improving Media Tribological Performances." IEEE Transactions on Magnetics, vol. 35, No. 5, Sep. 1999. 3 Pages.

*Primary Examiner* — Julio J Maldonado
*Assistant Examiner* — Moazzam Hossain
(74) *Attorney, Agent, or Firm* — Eschweiler & Associates, LLC (57) ABSTRACT

The present disclosure relates to a bump processing method and/or resulting MEMS-CMOS structure, in which one or more anti-stiction bumps are formed within a substrate prior to the formation of a cavity in which the one or more anti-stiction bumps reside. By forming the one or more anti-stiction bumps prior to a cavity, the sidewall angle and the top critical dimension (i.e., surface area) of the one or more anti-stiction bumps are reduced. The reduction in sidewall angle and critical dimension reduces stiction between a substrate and a moveable part of a MEMS device. By reducing the size of the anti-stiction bumps through a processing sequence change, lithographic problems such as reduction of the lithographic processing window and bump photoresist collapse are avoided.

19 Claims, 6 Drawing Sheets

(51) Int. Cl.
*H01L 23/12* (2006.01)
*H01L 29/84* (2006.01)
*B81B 3/00* (2006.01)
*H01L 23/053* (2006.01)
*H01L 23/00* (2006.01)

(52) U.S. Cl.
CPC ............... *H01L2224/81139* (2013.01); *H01L 2224/16145* (2013.01); *H01L 2224/13021* (2013.01); *H01L 2224/8114* (2013.01); *H01L 23/053* (2013.01); *B81B 2203/0361* (2013.01); *H01L 24/81* (2013.01); *B81B 2203/0384* (2013.01)

USPC ........... 438/125; 438/595; 438/613; 438/692; 438/791; 438/52; 257/415; 257/414; 257/704; 257/E21.505; 257/E23.181; 73/514.01; 73/510; 73/514.32; 216/88; 216/89; 216/2

(56) References Cited

U.S. PATENT DOCUMENTS

| | | | |
|---|---|---|---|
| 2005/0020050 A1* | 1/2005 | Huang | 438/613 |
| 2011/0260268 A1* | 10/2011 | Lee et al. | 257/416 |
| 2012/0217610 A1* | 8/2012 | Hopper et al. | 257/506 |

* cited by examiner

MECHANISM FOR MEMS BUMP SIDE WALL ANGLE IMPROVEMENT

BACKGROUND

In recent years, it is increasingly common for Micro-Electro-Mechanical Systems (MEMS) to be incorporated into integrated chips formed by a complementary metal-oxide-semiconductor (CMOS) process. The incorporation of MEMS (e.g., sensors, integrated optics, biochips, etc.) into a CMOS process allows for widespread use of MEMS fabricated with a high throughput.

SUMMARY OF THE DISCLOSURE

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to the more detailed description that is presented later.

The present disclosure relates to a bump processing method and/or resulting MEMS-CMOS structure, in which one or more anti-stiction bumps are formed within a substrate prior to the formation of a cavity in which the one or more anti-stiction bumps reside. By forming the one or more anti-stiction bumps prior to a cavity, the sidewall angle and the top critical dimension (i.e., surface area) of the one or more anti-stiction bumps are reduced. The reduction in sidewall angle and critical dimension reduces stiction between a substrate and a moveable part of a MEMS device. By reducing the size of the anti-stiction bumps through a processing sequence change, lithographic problems such as reduction of the lithographic processing window and bump photoresist collapse are avoided.

In one embodiment, the present disclosure relates to a method for bump processing. The method comprises forming a masking layer on a substrate to define a first etching area. The substrate is etched in the first etching area to form one or more anti-stiction bumps. A second masking layer is then formed, which exposes the one or more anti-stiction bumps to define a second masking area that contains the one or more anti-stiction bumps. The substrate is etched in the second etching area to form a cavity comprising the one or more anti-stiction bumps. Etching the substrate in the second etching area reduces the sidewall angle of the one or more anti-stiction bumps formed by etching the substrate in the first etching area.

In another embodiment, the present disclosure relates to a method for bump processing. The method comprises forming a patterned photoresist layer on top of a dielectric material, disposed on a substrate, to expose a first etching area that defines a location of one or more anti-stiction bumps. The dielectric material is then etched to a first depth to form the one or more anti-stiction bumps. A portion of the patterned photoresist layer is removed above the one or more anti-stiction bumps to expose a second etching area. The second etching area is then etched in the second etching area to a second depth to form a cavity comprising the one or more anti-stiction bumps. Etching the substrate in the second etching area reduces the sidewall angle of the one or more anti-stiction bumps.

In yet another embodiment, the present disclosure relates to a CMOS-MEMS integrated chip system. The CMOS-MEMS integrated chip system comprises a CMOS substrate having one or more metal interconnect layers comprised within a dielectric material. A cavity extends from a top surface of the dielectric material to a depth. One or more anti-stiction bumps are located within a bottom surface of the cavity and have a height smaller than the depth. The one or more anti-stiction bumps have a sidewall angle of approximately 50° to 75°. A MEMS chip is disposed within the cavity to have a moveable part opposing the bottom surface of the cavity.

The following description and annexed drawings set forth in detail certain illustrative aspects and implementations of the disclosure. These are indicative of but a few of the various ways in which the principles of the disclosure may be employed.

BRIEF DESCRIPTION OF THE DRAWINGS

FIGS. 2a-3b are cross-sectional views of some embodiments of an example semiconductor substrate upon which the first exemplary method of bump processing is performed.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

A MEMS device may be integrated onto a CMOS wafer by positioning a MEMS chip (i.e., an integrated chip comprising one or more MEMS devices) into a shallow cavity on the CMOS wafer (i.e., a wafer formed by a CMOS process), such that moveable parts of the MEMS chip oppose the CMOS wafer. When moveable parts of a MEMS chip come into close proximity with a smooth surface of the CMOS wafer, molecular attractive forces between the moveable parts and the CMOS wafer result in stiction (i.e., static friction). When the roughness of a surface is small, a large part of that surface will contribute to the stiction. However, when the roughness of a surface is larger, a smaller part of the surface contributes to the stiction. Therefore, CMOS-MEMS systems are engineered to have anti-stiction bumps located on a surface of a CMOS wafer that is opposed by the moveable parts of a MEMS chip. The anti-stiction bumps reduce the area of interaction between the moveable parts of a MEMS chip and an opposing CMOS wafer, thereby decreasing stiction.

Anti-stiction bumps may be formed by first etching a cavity within a CMOS substrate (e.g., a dielectric layer). The cavity is etched to a depth that is substantially equal to the distance from the top of the bumps to the top surface of the substrate. An etch mask is then formed within the cavity and the substrate is subsequently etched a second time, after the cavity is formed, to form one or more anti-stiction bumps within the cavity. The second etching step etches the substrate to a depth that is substantially equal to the height of the bumps. The high degree of anisotropy in the second etching step cause the anti-stiction bumps to have a relatively large sidewall angle (e.g., 80° to 90°) resulting in a bump top critical dimension that substantially corresponds to the etch mask dimensions.

It has been appreciated that reducing the size of anti-stiction bumps (e.g., the top critical dimension of an anti-stiction bump) can reduce stiction between a substrate (e.g., CMOS wafer) and a moveable part of a MEMS device. However, achieving a smaller anti-stiction bump size through lithographic means both reduces the lithographic processing window and enhances bump photoresist collapse. Therefore, the present disclosure provides for a method of anti-stiction bump patterning that reduces the size of the top critical dimension of anti-stiction bumps by a process sequence change rather than by lithographic means.

In one embodiment, the method comprises forming a masking layer on a top surface of a substrate (e.g., a dielectric material) and then etching the substrate to form one or more anti-stiction bumps within the top surface of the substrate. The masking layer is then partially removed before the substrate is further etched to form a cavity that contains the one or more anti-stiction bumps. Therefore, the present disclosure executes a process that forms one or more anti-stiction bumps prior to executing a process that defines a cavity within a substrate in which the one or more anti-stiction bumps reside. By forming the one or more anti-stiction bumps before the cavity, the etching used to form the cavity decreases the sidewall angle of the one or more anti-stiction bumps, thereby reducing the top critical dimension (i.e., surface area) of the one or more anti-stiction bumps and reducing stiction between the substrate and an opposing moveable MEMS surface.

Figure 1:
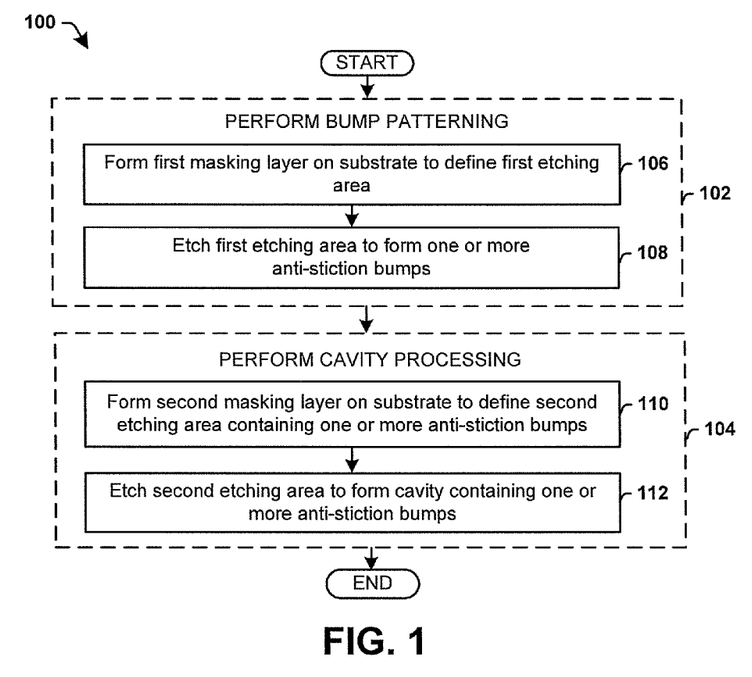
FIG. 1 is a flow diagram illustrating some embodiments of a first exemplary method of bump processing.

FIG. 1 is a flow diagram illustrating some embodiments of a first method 100 of bump processing. FIGS. 2a-3b are cross-sectional views of some embodiments of an exemplary semiconductor substrate upon which the first method 100 of bump processing is performed. While methods disclosed herein are illustrated and described below as a series of acts or events, it will be appreciated that the illustrated acts or events are not to be interpreted in a limiting sense. For example, one or more of the acts depicted herein may be carried out in one or more separate acts and/or phases.

Method 100 executes a process that performs bump patterning at 102 to form one more anti-stiction bumps in a substrate surface, prior to performing cavity processing at 104 to form a cavity within the substrate surface that contains the one or more anti-stiction bumps (i.e., etching a cavity overlying an area containing the one or more anti-stiction bumps).

Figure 2A:
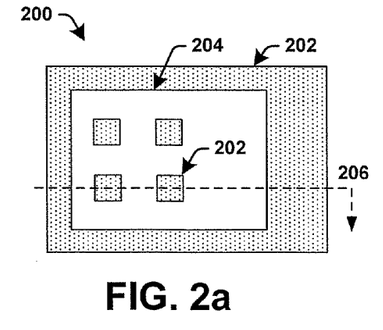
Figure 2B:
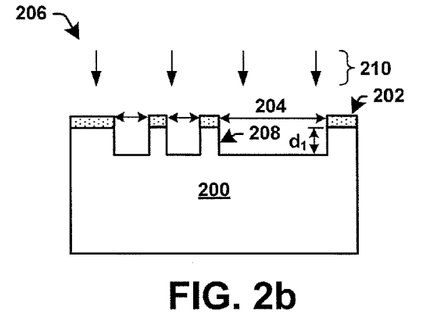

More particularly, the method 100 performs bump processing by forming a first masking layer on a top surface of a substrate at 106. As illustrated in FIG. 2a, in some embodiments the substrate 200 comprises a first masking layer 202 (shown as a dotted fill pattern) that defines a first etching area 204 (shown in white), in which the underlying substrate 200 is exposed. The first masking layer is configured to operate as an etch mask that selectively masks the surface of the substrate from being etched. In one embodiment, the first masking layer may comprise a photoresist layer.

At 108 the first etching area is etched to form one or more anti-stiction bumps within the surface of the substrate. As illustrated in cross sectional view 206, shown in FIG. 2b, in some embodiments the etchant 210 etches away the substrate 200 in the first etching area 204 to a first depth $d_1$, which is substantially equal to the height of one or more anti-stiction bumps 208 that protrude from the first etching area.

At 110 a second masking layer, which exposes the one or more anti-stiction bumps, is formed on the top surface of the substrate to define a second masking area. The second masking layer is formed to contain the one or more anti-stiction bumps. In one embodiment, the second masking layer is formed to mask a second etching area that is a subset of the first etching area. In one embodiment, the first and second masking layer may comprise a same masking layer (e.g., the same photoresist layer), such that a part of the first masking layer is removed from the top surface of the substrate to form the second masking layer. In another embodiment, the first and second masking layer may comprise separate masking layers, such that the first masking layer is applied to and removed from the substrate before the second masking layer is applied to the substrate.

Figure 3A:
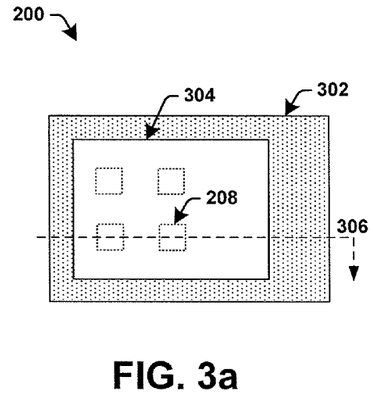
Figure 3B:
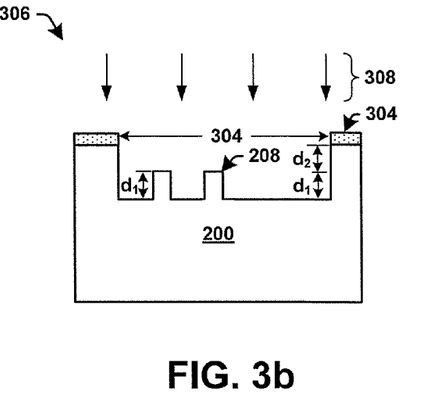

As illustrated in FIG. 3a, in some embodiments the substrate 200 comprises a second masking layer 302 (shown as a dotted fill pattern) that defines a second etching area 304 (shown in white), in which the underlying substrate 200 is exposed. The second etching area 304 is selected to contain the one or more anti-stiction bumps 208 along with an additional abutting area that defines a cavity that contains the one or more anti-stiction bumps 208. In one embodiment, the second etching area may contain the first etching area along with the areas in which the one or more anti-stiction bumps 208 were formed.

At 112 the second etching area is etched to form a cavity comprising the one or more anti-stiction bumps. As illustrated in cross sectional view 306, shown in FIG. 3b, in some embodiments the substrate 200 is etched away by an etchant 308 in the second etching area 304, resulting in the formation of a cavity containing the one or more anti-stiction bumps 208. The substrate 200 is etched away in the second etching area 304 to a second depth $d_2$ that is equal to the distance from the top of the one or more anti-stiction bumps 208 to the top surface of the substrate 200. The cumulative etching of the first and second etching areas results in a cavity having a maximum depth equal to the sum of the first depth plus the second depth (i.e., $d_1+d_2$), while the bumps extend to a depth of approximately $d_2$ below the top surface of the substrate.

Since the one or more anti-stiction bumps are contained within the second etching area, they are etched along with the cavity. This additional etching (step 112) of the one or more anti-stiction bumps reduces the sidewall angle of the one or more anti-stiction bumps formed by the first etching step (step 108).

Figure 4A:
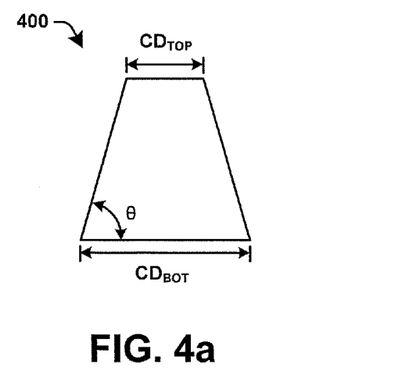
FIGS. 4a and 4b illustrate cross sectional views of some embodiments of an anti-stiction bump formed according to a bump processing method disclosed herein compared to an anti-stiction bump formed according to a prior art method.
Figure 4B:
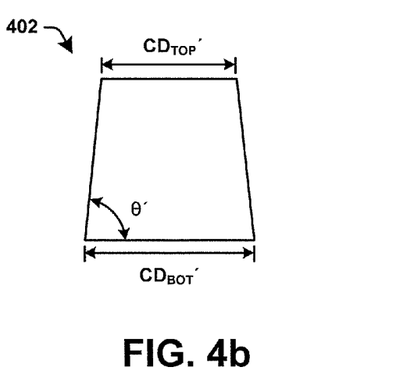

For example, FIG. 4a illustrates a cross sectional view of some embodiments of an anti-stiction bump 400 that is formed using bump processing method 100. The anti-stiction bump 400 has a critical dimension at the bottom of the bump of $CD_{BOT}$ and a critical dimension at the top of the bump of $CD_{TOP}$, resulting in a sidewall angle θ of approximately 50° to 75°. In contrast, FIG. 4b illustrates a cross sectional view 402 of an anti-stiction bump that is formed from a single etching step (e.g., that is formed by etching a bump within an already formed cavity). The anti-stiction bump 402 has a critical dimension at the bottom of the bump of $CD_{BOT}$ that is the same as anti-stiction bump 400. However, the critical dimension at the top of anti-stiction bump 402 is equal to $CD_{TOP}'$, which is larger than $CD_{TOP}$, resulting in a larger sidewall angle θ' of approximately 80° to 85°.

Therefore, as illustrated in FIGS. 4a and 4b, by first forming the one or more anti-stiction bumps, and then subjecting the anti-stiction bumps to an additional etch to form a cavity, the sidewall angle of the anti-stiction bumps is reduced, resulting in a smaller top critical dimension.

Figure 5:
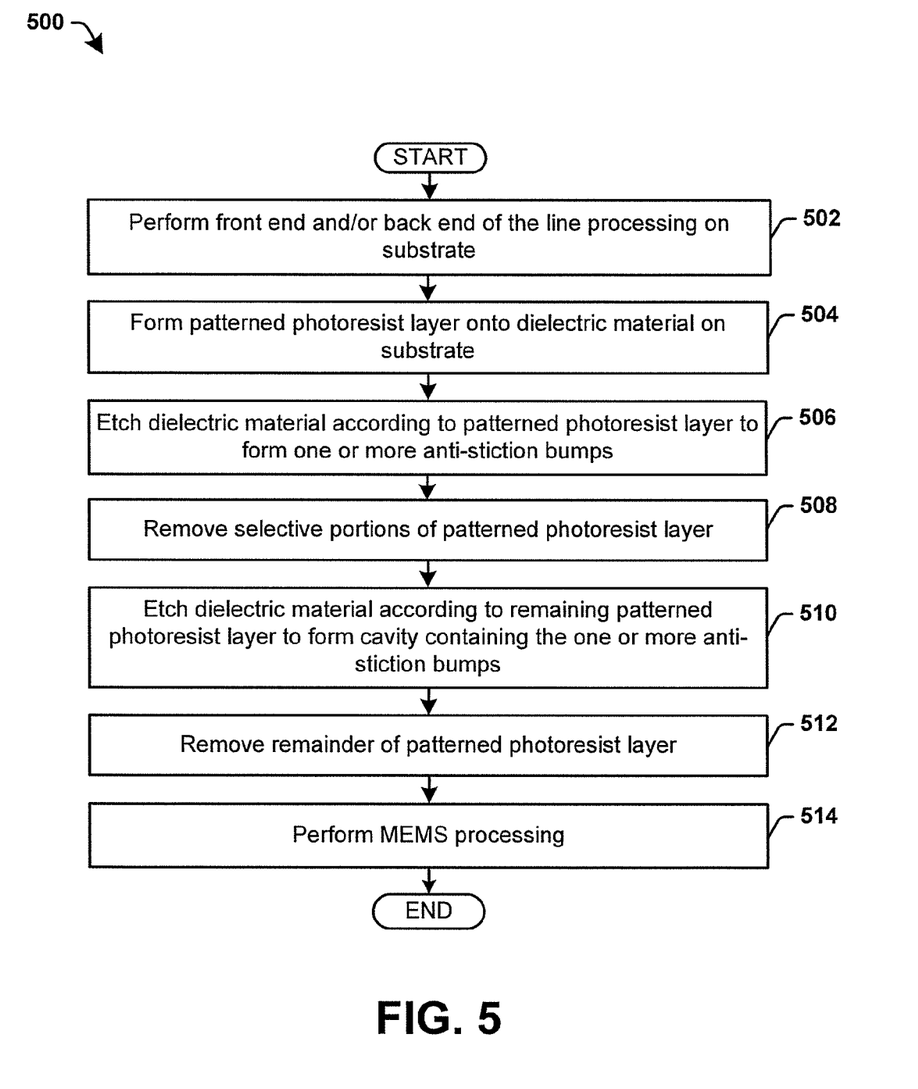
FIG. 5 is a flow diagram illustrating some embodiments of a more detailed method of bump processing.

FIG. 5 is a flow diagram illustrating some embodiments of a more detailed method 500 of bump processing. FIGS. 6-10 are cross-sectional views of some embodiments of an example semiconductor substrate upon which method 500 is performed.

At 502 a substrate may be processed to form one or more processing layers. The substrate may comprise any type of semiconductor body (e.g., silicon, SiGe, SOI) such as a semiconductor wafer or one or more die on a wafer, as well as any other type of semiconductor and/or epitaxial layers grown thereon and/or otherwise associated therewith. The substrate may be processed according to a complementary metal-oxide-semiconductor (CMOS) process (e.g., having minimum metal pitch of 180 nm, or 90 nm, or 45 nm, etc.). The processing may comprise front end of the line processing to form one or more devices (e.g., CMOS transistor devices). The processing may also comprise back end of the line processing to form one or more metal interconnect layers that couple the one or more devices together.

Figure 6:
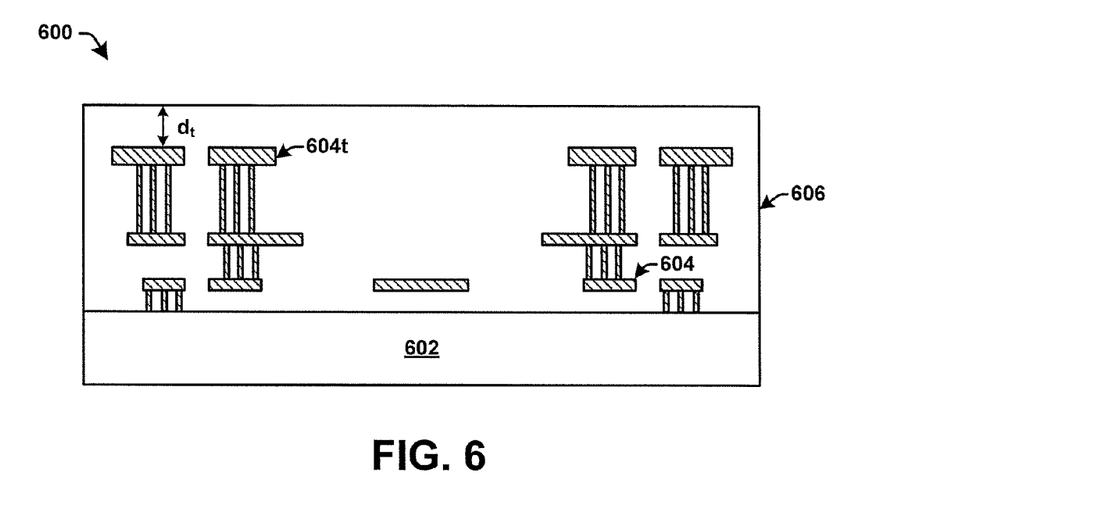
FIGS. 6-10 are cross-sectional views of some embodiments of an example semiconductor substrate upon which a method of bump processing is performed.

The cross sectional view 600 of FIG. 6 illustrates some embodiments of an exemplary substrate. The substrate comprises a plurality of metal interconnect layers 604 formed within a dielectric material 606 located above a semiconductor substrate 602. As illustrated in cross sectional view 600, the dielectric material 606 extends above the top metal interconnect layer 604t by a distance $d_t$. The dielectric material 606 may comprise one or more dielectric materials such as for example, a low k dielectric, a SiCO dielectric, and/or an oxide (e.g., silicon dioxide ($SiO_2$)). Typically, the substrate comprises a stack of a plurality of metal interconnect layers 604 formed in different dielectric materials (e.g., a first metal layer formed in a low-k dielectric, a second metal layer formed in a SiCO dielectric, etc.). The top metal interconnect layer 604t is often contained in a dielectric material 606 comprising an oxide (e.g., $SiO_2$) due to the mechanical strength of the oxide.

At 504 a patterned photoresist layer is formed on a dielectric material on the substrate. The patterned photoresist layer is formed on a top surface of the dielectric material, after the general CMOS process is completed, as a masking layer to cover the underlying dielectric material. The patterned photoresist forms a first etching area that defines locations of one or more anti-stiction bumps. The patterned photoresist layer may be formed by depositing photoresist (e.g., spin coating the dielectric material with the photoresist at a high RPM) onto the dielectric material and then patterning the deposited photoresist by selective exposure to a light source (e.g., UV light) and subsequent development of the exposed photoresist.

Figure 7:
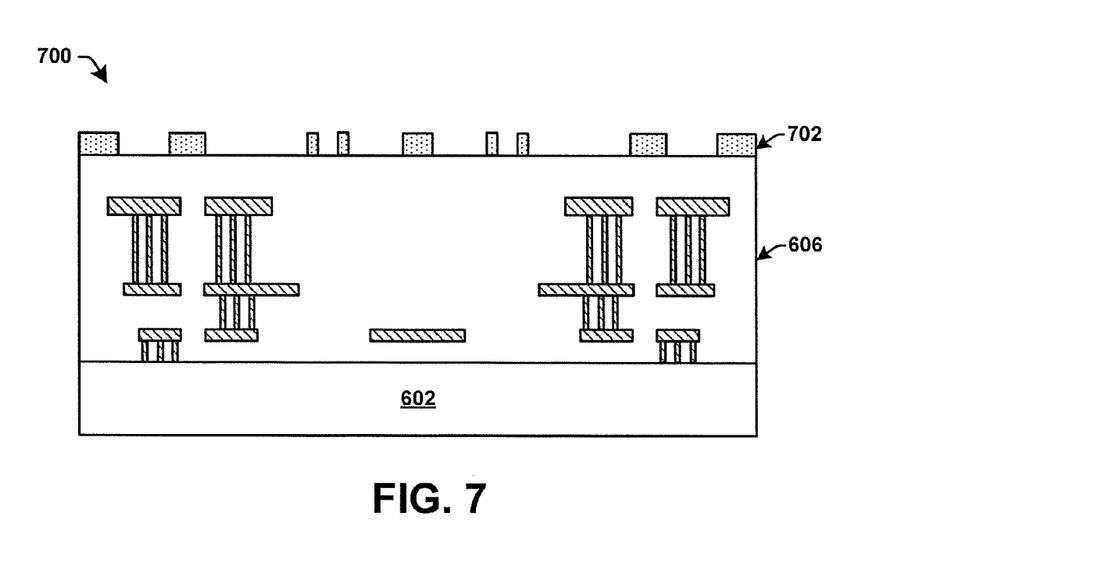

As illustrated in the cross sectional view 700 of FIG. 7, in some embodiments a photoresist layer 702 is selectively patterned to expose the underlying dielectric material 606 so as to define a location of one or more anti-stiction bumps in areas of the dielectric material 606 that are covered by the photoresist layer 702. In one embodiment, the photoresist layer may be formed to have a thickness of approximately 600 nm.

At 506 the dielectric material is etched according to the patterned photoresist layer to form one or more anti-stiction bumps. In one embodiment, the dielectric material may be etched using a dry etchant such as a plasma etching or a reactive ion etching (RIE) (e.g., an inductively coupled plasma reactive ion etching in which high energy ions bombard the surface of the dielectric material), for example. In various embodiments, the RIE etch may use a fluorine based etching chemistry (e.g., $CF_4$, $C_3F_8$, $C_4F_8$, etc.) to etch a dielectric layer comprising an oxide (e.g., $SiO_2$). In an alternative embodiment, a wet etchant may be used to etch the dielectric material.

The etch of step 506 is performed to etch the dielectric material to a depth that is equal to the height of the one or more anti-stiction bumps. In one embodiment, the etch of step 506 is performed to etch the dielectric material to a first depth of approximately 500-1000 nm, resulting in the formation of one or more anti-stiction bumps 804 having a height of approximately 500-1000 nm. In such an embodiment, the one or more anti-stiction bumps may be formed to have a diameter of approximately 350 Å, for example.

Figure 8:
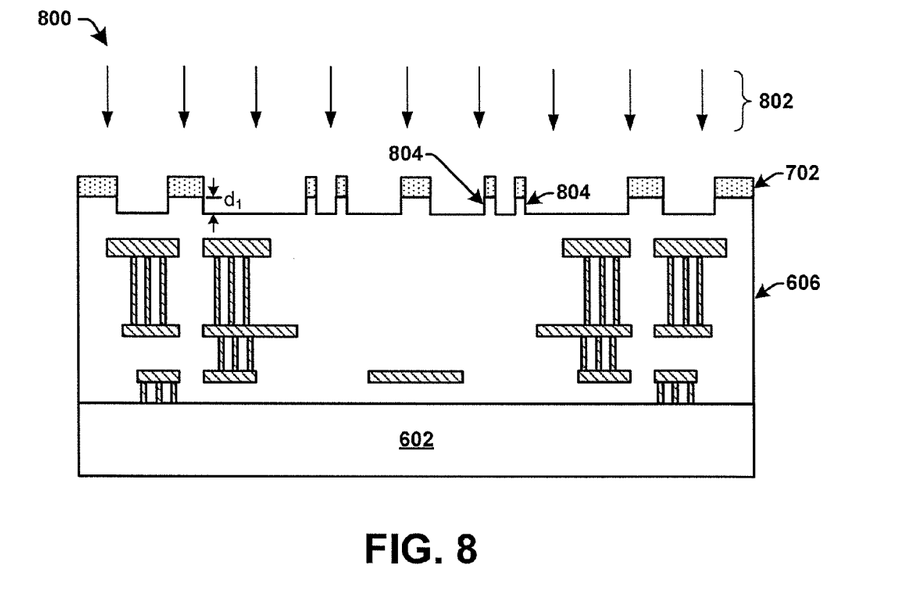

As illustrated in the cross sectional view 800 of FIG. 8, in some embodiments an etchant 802 (e.g., RIE etchant) etches away the underlying dielectric material 606 to a first depth of $d_1$ in the first etching area. The removal of the underlying dielectric material forms one or more anti-stiction bumps 804 that protrude from the first etching area.

At 508 one or more portions of the photoresist layer may be selectively removed. The one or more portions of the photoresist layer may comprise photoresist located above the one or more anti-stiction bumps (formed in step 506), so that removal of the one or more portions of the photoresist layer exposes the underlying dielectric material to define a second etching area that contains the one or more anti-stiction bumps. By removing portions of the photoresist layer, a single photoresist layer can be used for both etching steps of the bump processing (e.g., the first etching step 506 to form the one or more anti-stiction bumps and the second etching step 510 to form a cavity containing the one or more anti-stiction bumps).

Figure 9:
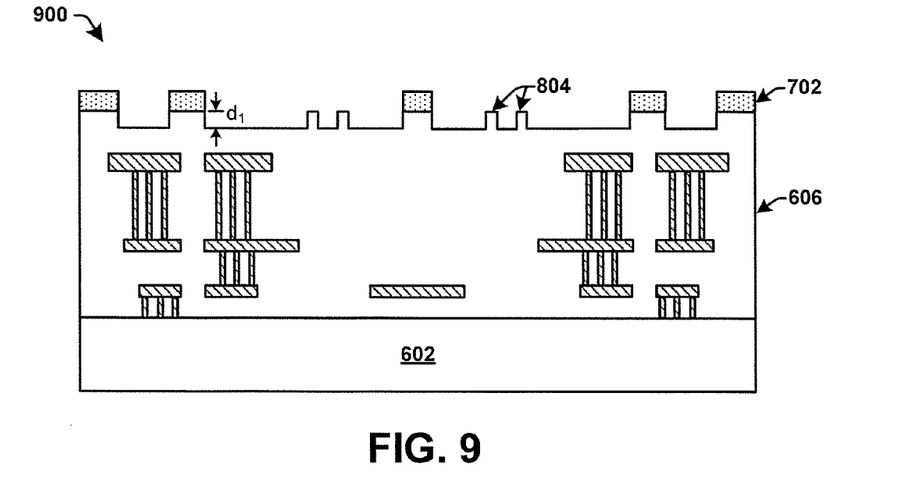

As illustrated in the cross sectional view 900 of FIG. 9, in some embodiments the photoresist layer 702 is selectively removed above the one or more anti-stiction bumps 804 to expose the one or more anti-stiction bumps 804, while remaining on other areas of the dielectric material. In other embodiments, the photoresist may be removed from above the one or more anti-stiction bumps 804 as well as from above other parts of the dielectric material (e.g., to define a cavity larger than the first etching area). The selective removal of the photoresist layer 702 exposes a second etching area that defines a location of a cavity, which includes the one or more anti-stiction bumps.

At 510 the dielectric material is etched according to the remaining patterned photoresist layer to form a cavity including the one or more anti-stiction bumps. The etch of step 510 is performed to etch the dielectric material to a second depth that is equal to the distance from the top of the one or more anti-stiction bumps to the top surface of the dielectric material. In one embodiment, the etch of step 510 is performed (e.g., using a plasma etching or a RIE plasma dry etch) to etch the dielectric material to a second depth of approximately 1.5 um. In such an embodiment, the second depth of the etch of step 510 (the second etch) is larger than the first depth of the etch of step 506 (the first etch), since the second etch is used to form the cavity while the first etch is used to form the bumps within the cavity. The combination of the first and second etches results in a cavity having an maximum depth equal to the depth of the first etching step (e.g., step 506) plus the depth of the second etching step (e.g., approximately 2 um).

Figure 10:
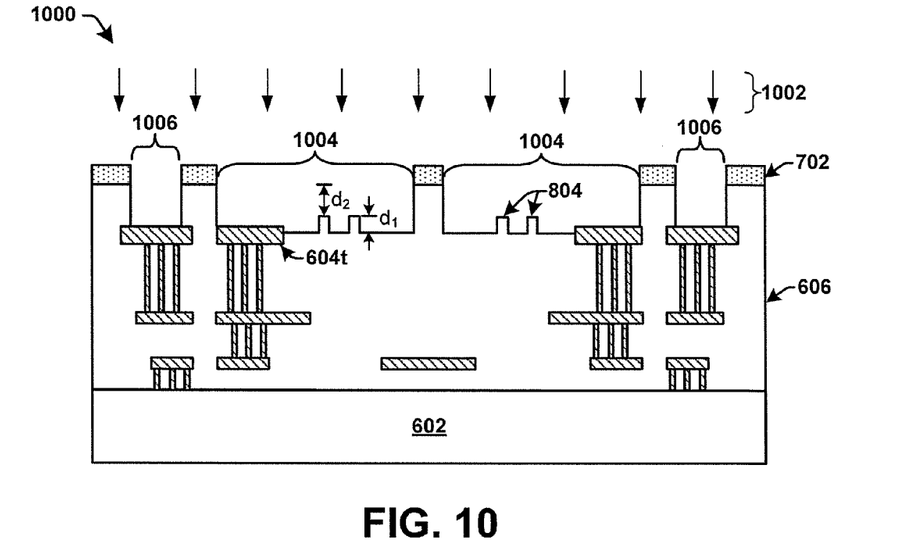

FIG. 10 illustrates a cross sectional view 1000 of some embodiments of a dielectric material being etched by an etchant 1002 (e.g., RIE etchant) that etches away the underlying dielectric material 606 to a second depth of $d_2$ in the second etching area. Since the photoresist layer 702 is removed above the one or more anti-stiction bumps 804 the bumps are exposed to the etchant 1002, causing the anti-stiction bumps 804 to be etched along with the cavity 1004. The etchant 1002 etches through the dielectric material 606 to the top metal interconnect layer 604t, allowing for contacts to be made through the dielectric material 606 to the top metal interconnect layer 604t.

At 512 the remaining patterned photoresist layer is removed from the dielectric material. Removal of the remaining patterned photoresist results in the surface of the dielectric material having a cavity comprising one or more anti-stiction bumps. The resulting structure is formed to have anti-stiction bumps with a sidewall angle of approximately 50° to 75°.

At 514 MEMS processing is performed. In one embodiment, MEMS processing comprises bringing a chip containing a MEMS device (i.e., a MEMS chip) into contact with the cavity of the dielectric material (e.g., a cavity within a CMOS wafer). Since the one or more anti-stiction bumps within the cavity are formed prior to the formation of the cavity, the sidewall angle and the top critical dimension (i.e., surface area) of the one or more anti-stiction bumps is reduced, thereby reducing stiction between the substrate and the MEMS device.

Figure 11:
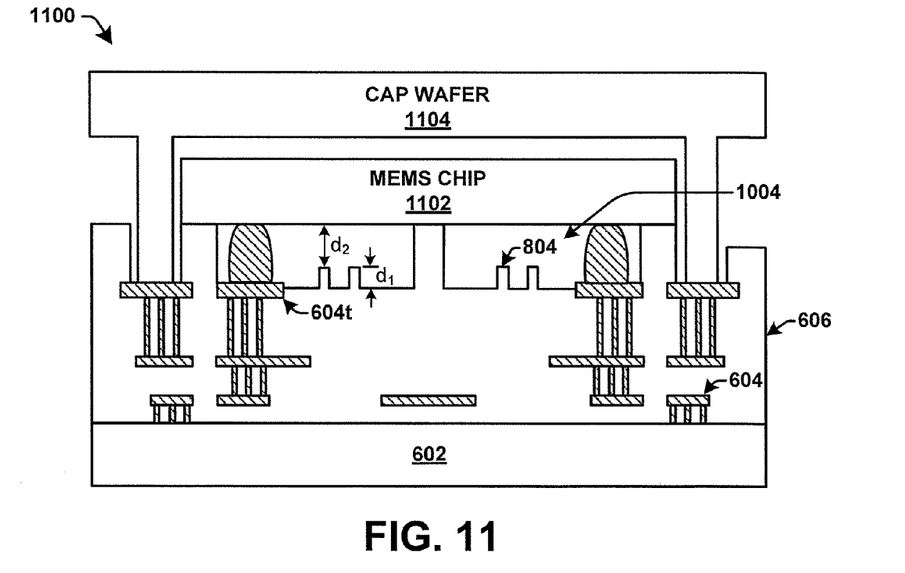
FIG. 11 is a cross sectional view of some embodiments of a MEMS-CMOS system formed according to a bump process method disclosed herein.

FIG. 11 illustrates a cross sectional view 1100 of some embodiments of a CMOS-MEMS integrated chip system generated by a bump processing method disclosed herein (e.g., method 100 or 500). As illustrated in FIG. 11, a cavity 1004 extends from a top surface of the dielectric material 606, having one or more metal interconnect layers 604, to a depth of $d_1+d_2$. One or more anti-stiction bumps 804 are located on a bottom surface of the cavity 1004. The one or more anti-stiction bumps 804 have a height $d_2$, which is smaller than the depth of the cavity. In one embodiment, the one or more anti-stiction bumps 804 have a sidewall angle of approximately 50° to 75°. In a more particular embodiment, the one or more anti-stiction bumps 804 have a sidewall angle of approximately 60° to 65°. In one embodiment, wherein the second masking area is formed by removing a portion of the first masking area, the sidewall angles of the cavities are continuous (e.g., have a substantially constant slope) since the same photoresist layer is used as a mask for both etching steps.

A MEMS chip 1102 is disposed within the cavity 1004. The MEMS chip 1102 may be electrically connected to one or more metal interconnect layers 604. The movable parts of the MEMS chip 1102 oppose the one or more anti-stiction bumps 804 within the cavity 1004, thereby providing for a roughness in the surface opposing the moveable parts of the MEMS chip 1102 that reduces stiction between the MEMS chip 1102 and the CMOS wafer. In one embodiment, a cap wafer 1104 may be configured above the MEMS chip 1102. The cap wafer 1104 is configured to protect the MEMS chip 1102 against external interference during operation. In various embodiments, the cap wafer 1104 may comprise a silicon or glass wafer that is placed above the MEMS chip 1102.

It will be appreciated that while reference is made throughout this document to exemplary structures in discussing aspects of methodologies described herein (e.g., the structure presented in FIGS. 6-10, while discussing the methodology set forth in FIG. 5), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method of bump processing, comprising:
   forming a first masking layer on a substrate comprising a dielectric layer having one or more metal interconnect layers to define a first etching area;
   forming one or more anti-stiction bumps by etching the substrate in the first etching area;
   forming a second masking layer, which exposes the one or more anti-stiction bumps, to define a second etching area that contains the one or more anti-stiction bumps; and
   further etching the dielectric layer on the substrate in the second etching area forming a cavity that extends through the dielectric layer from a bottom surface of the cavity located within the dielectric layer to a top surface of the dielectric layer, wherein the cavity comprises the one or more anti-stiction bumps connected to the bottom surface of the cavity, and wherein etching the dielectric layer on the substrate in the second etching area reduces a sidewall angle of the one or more anti-stiction bumps formed by etching the dielectric layer on the substrate in the first etching area;
   wherein some dielectric material of the dielectric layer is positioned between the cavity and a semiconductor substrate.

2. The method of claim 1, wherein the one or more anti-stiction bumps have a sidewall angle of approximately 50° to 75°.

3. The method of claim 1, wherein forming the second masking layer comprises removing a portion of the first masking layer.

4. The method of claim 1, wherein the first etching area is a subset of the second etching area.

5. The method of claim 1, wherein the first etching area is etched to a first depth and the second etching area is etched to a second depth greater than the first depth.

6. The method of claim 1, wherein the first masking layer comprises first photoresist layer and the second masking layer comprises a second photoresist layer.

7. The method of claim 6, wherein the second photoresist layer is formed by removing a part of the first photoresist layer.

8. The method of claim 1, wherein etching of the substrate is performed by a plasma dry etch.

9. The method of claim 1, wherein the cavity extends from the top surface of the dielectric layer to at least one of the one or more metal interconnect layers.

10. The method of claim 1, further comprising:
bringing a chip containing a Micro-Electro-Mechanical Systems (MEMS) device into contact with the cavity of the substrate, wherein a movable part of the MEMS device opposes the one or more anti-stiction bumps located within the cavity.

11. A method of bump processing, comprising:
forming a patterned photoresist layer on top of a dielectric layer, disposed on a substrate, to expose a first etching area that defines a location of one or more anti-stiction bumps;
forming one or more anti-stiction bumps by etching the dielectric layer to a first depth;
removing a portion of the patterned photoresist layer above the one or more anti-stiction bumps to expose a second etching area; and
further etching the dielectric layer in the second etching area to a second depth forming a cavity that extends through the dielectric layer from a bottom surface of the cavity located within the dielectric layer to a to surface of the dielectric layer, wherein the cavity comprises the one or more anti-stiction bumps connected to the bottom surface of the cavity, and wherein etching the dielectric layer on the substrate in the second etching area reduces a sidewall angle of the one or more anti-stiction bumps formed by etching the dielectric layer on the substrate in the first etching area.

12. The method of claim 11, wherein the one or more anti-stiction bumps have a sidewall angle of approximately 50° to 75°.

13. The method of claim 11, wherein the first depth is smaller than the second depth.

14. The method of claim 11, wherein the first etching area is a subset of the second etching area.

15. The method of claim 11,
wherein the dielectric layer comprising one or more metal interconnect layers; and
wherein the cavity extends from the top surface of the dielectric layer to at least one of the one or more metal interconnect layers.

16. The method of claim 11, wherein the dielectric layer comprises silicon dioxide ($SiO_2$).

17. The method of claim 11, further comprising:
bringing a chip containing a Micro-Electro-Mechanical Systems (MEMS) device into contact with the cavity of the substrate, wherein a movable part of the MEMS device opposes the one or more anti-stiction bumps located within the cavity.

18. The method of claim 1, wherein the one or more anti-stiction bumps comprise the dielectric layer.

19. The method of claim 1, wherein the first masking layer and the second masking layer are formed onto the dielectric layer.

* * * * *

UNITED STATES PATENT AND TRADEMARK OFFICE
CERTIFICATE OF CORRECTION

PATENT NO. : 8,940,586 B2  Page 1 of 1
APPLICATION NO. : 13/303754
DATED : January 27, 2015
INVENTOR(S) : Kuo et al.

It is certified that error appears in the above-identified patent and that said Letters Patent is hereby corrected as shown below:

In the claims

Column 9, Claim 11, Line 28 replace "…dielectric layer to a to surface…" with --…dielectric layer to a top surface…--

Signed and Sealed this
Twenty-second Day of March, 2016

Michelle K. Lee
*Director of the United States Patent and Trademark Office*